US009590592B2

(12) United States Patent
Johal et al.

(10) Patent No.: US 9,590,592 B2
(45) Date of Patent: Mar. 7, 2017

(54) CONFIGURABLE CAPACITOR ARRAYS AND SWITCHED CAPACITOR CIRCUITS

(71) Applicant: Cypress Semiconductor Corporation, San Jose, CA (US)

(72) Inventors: Jaskarn Singh Johal, Mukilteo, WA (US); Erhan Hancioglu, Bothell, WA (US); Renee Leong, Seattle, WA (US); Harold M. Kutz, Edmonds, WA (US); Eashwar Thiagarajan, Bothell, WA (US); Onur Ozbek, Kirkland, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/752,052

(22) Filed: Jun. 26, 2015

(65) Prior Publication Data

US 2016/0285433 A1 Sep. 29, 2016

Related U.S. Application Data

(60) Provisional application No. 62/083,818, filed on Nov. 24, 2014.

(51) Int. Cl.
*H03H 11/12* (2006.01)
*H03H 19/00* (2006.01)
*G06G 7/06* (2006.01)
*H03K 19/177* (2006.01)

(52) U.S. Cl.
CPC ............. *H03H 19/004* (2013.01); *G06G 7/06* (2013.01); *H03K 19/177* (2013.01)

(58) Field of Classification Search
USPC .................................. 327/551–554, 564–566
See application file for complete search history.

(56) References Cited

U.S. PATENT DOCUMENTS

| 4,446,438 A * | 5/1984 | Chang ................. H03H 19/002 327/337 |
| 4,803,462 A * | 2/1989 | Hester ................. H03M 1/0682 327/407 |
| 5,414,614 A | 5/1995 | Fette et al. |
| 5,608,345 A | 3/1997 | MacBeth et al. |

(Continued)

FOREIGN PATENT DOCUMENTS

WO 2008087583 A2 7/2008

OTHER PUBLICATIONS

Ben Kropf, "PSoCED® 1—Dynamic Reconfiguration with PSoC Designer," Cypress Semiconductor, AN2104; 15 pages.

(Continued)

*Primary Examiner* — An Luu

(57) ABSTRACT

A fingerprint sensing circuit, system, and method is disclosed. The fingerprint sensor maybe include a plurality of inputs coupled to a plurality of fingerprint sensing electrodes and to an analog front end. The analog front end may be configured to generate at least one digital value in response to a capacitance of at least one of the plurality of fingerprint sensing electrodes. Additionally, the analog front end may include a quadrature demodulation circuit to generate at least one demodulated value for processing by a channel engine. The channel engine may generate a capacitance result value that is based, in part, on the demodulated value and is stored in a memory.

20 Claims, 16 Drawing Sheets

(56) References Cited

U.S. PATENT DOCUMENTS

| | | | |
|---|---|---|---|
| 7,199,745 B2* | 4/2007 | Tachibana | H03M 1/468 341/155 |
| 7,453,389 B1 | 11/2008 | Vu et al. | |
| 8,159,382 B2* | 4/2012 | Srinivasa | H03M 1/002 341/155 |
| 8,324,961 B2 | 12/2012 | Huang | |
| 8,324,968 B2 | 12/2012 | Honda et al. | |
| 8,436,672 B1 | 5/2013 | Thiagarajan et al. | |
| 8,487,655 B1 | 7/2013 | Kutz et al. | |
| 8,555,032 B2 | 10/2013 | Snyder | |
| 8,717,070 B1 | 5/2014 | Klein et al. | |
| 2005/0190092 A1 | 9/2005 | Gulati et al. | |
| 2008/0122670 A1 | 5/2008 | Klaassen | |
| 2010/0315278 A1 | 12/2010 | Hurrell | |
| 2011/0241916 A1 | 10/2011 | Fletcher et al. | |
| 2012/0242404 A1 | 9/2012 | Rajasekhar | |
| 2013/0135133 A1 | 5/2013 | Lin | |
| 2014/0233773 A1 | 8/2014 | Nestler et al. | |

OTHER PUBLICATIONS

Shivani Garg, "Dynamically Programmable Analog Signal Processing Using Fpaa," International Journal of Trends in Electronics Engineering, vol. 2, Issue 7, 2013; pp. 1-2; 2 pages.

International Search Report for International Application No. PCT/US15/41916 dated Oct. 23, 2015; 4 pages.

Written Opinion of the International Searching Authority for International Application No. PCT/US15/41916 dated Oct. 23, 2015; 10 pages.

\* cited by examiner

CONFIGURABLE CAPACITOR ARRAYS AND SWITCHED CAPACITOR CIRCUITS

RELATED APPLICATION

This patent application claims the benefit of U.S. Provisional Patent Application No. 62/083,818, filed Nov. 24, 2014, which is incorporated by reference herein.

TECHNICAL FIELD

The present disclosure relates generally to integrated circuit (IC) devices having programmable blocks, and more particularly to IC devices having programmable analog circuit blocks.

BACKGROUND

Integrated circuit (IC) devices can include both fixed function circuits and reconfigurable circuits. Programmable logic devices are well known and can enable an IC device to be reconfigured into a wide range of digital functions.

IC devices providing reconfigurable analog circuits are enjoying increased popularity in addressing analog applications. In some conventional approaches, configuration data for reprogrammable analog circuits is loaded into storage circuits (e.g., registers) to establish a desired analog function. A drawback to such arrangements can be to time/effort involved in reconfiguring circuits between different functions.

Conventionally, the connections/routings involved in enabling reconfigurable analog circuits can introduce limits to the performance of the IC device. For example, some conventional IC devices may not be suitable for very low noise applications. Similarly, very small impedance mismatches in routing paths prevent high fidelity processing of differential input signals.

As with most IC devices, any reduction in power consumption can be of great value, particular when the IC devices are deployed in portable electronic devices.

SUMMARY

A configurable capacitor array is disclosed. The configurable capacitor array may include a number of capacitor branches that may be configured along or in combination to execute a number of analog functions. Each of the capacitor branches of the configurable array may be configured to perform certain subsets of the analog functions. The configurable capacitor array may also include an amplifier circuit which, in combination with the capacitor branches, may be configured to execute the analog functions.

A universal analog block is disclosed. The configurable capacitor array may include a number of half universal analog blocks (half-UABs) including capacitor branches that may be configured along or in combination to execute a number of analog functions. Each of the capacitor branches of the UAB may be configured to perform certain subsets of the analog functions. The UAB array may also include an amplifier circuits which, in combination with the capacitor branches of the half-UABs, may be configured to execute the analog functions.

DETAILED DESCRIPTION

Figure 1A:
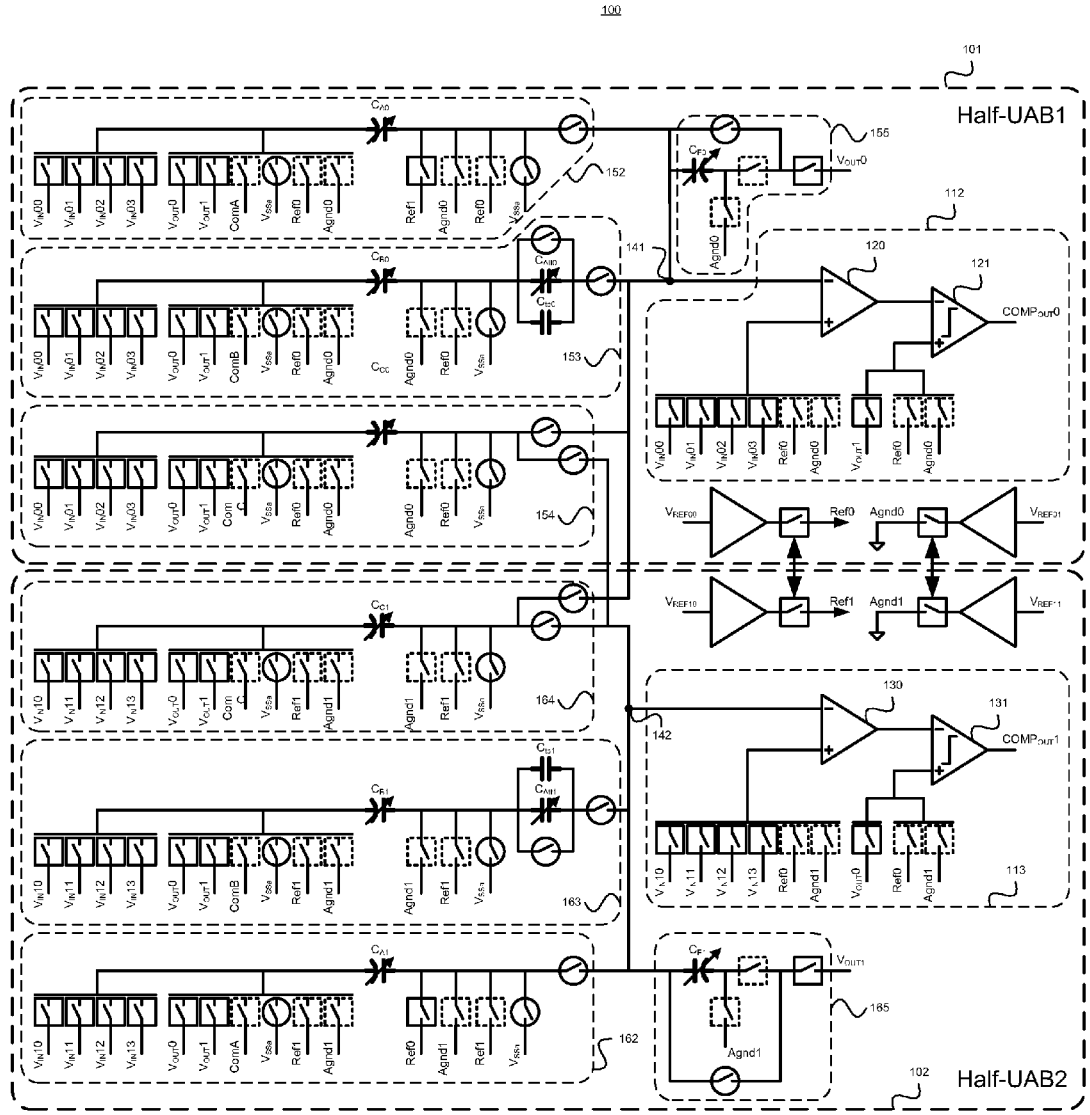
FIG. 1A illustrates a pair of universal analog block with configurable capacitor branches according to one embodiment.

In the following description, for purposes of explanation, numerous specific details are set forth in order to provide a thorough understanding of the embodiments of the present invention discussed herein. It will be evident, however, to one skilled in the art that these and other embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

For simplicity and clarity of illustration, reference numerals may be repeated among the figures to indicate corresponding or analogous elements. Numerous details are set forth to provide an understanding of the embodiments described herein. The examples may be practiced without these details. In other instances, well-known methods, procedures, and components are not described in detail to avoid obscuring the examples described. The description is not to be considered as limited to the scope of the examples described herein.

FIG. 1A illustrates a Universal Analog Block (UAB) 100 with two halves, 101 and 102, according to one embodiment. Each half-UAB 101 and 102 may include a number of capacitor branches and an amplifier circuit. Half-UAB 101 may include a first capacitor branch 152, "A", with a capacitor array CA0. The bottom plates of capacitor array CA0 may be coupled to a number of inputs including voltage inputs VIN00-VIN03. For clarity of illustration, the capacitors for all capacitor arrays are shown as polarized capacitors. The bottom plate is represented by the negative plate of the polarized capacitor, while the top plate is represented by the positive plate of the polarized capacitor. One of ordinary skill in the art would understand that a non-polarized capacitor may be used and that the plates of a non-polarized capacitor may be referred to as a "first plate" and a "second plate."

The voltage inputs coupled to the negative plate of CA0 may be from sources outside half-UAB 101 or even outside an integrated circuit, of which half-UAB 101 may be a part. In one embodiment, voltage inputs VIN00-VIN03 may be coupled to the bottom plate of capacitor array CA0 through T switches. A T switch may be comprises of two switches in series, the middle node of which is pulled to ground when the T switch is open. Such an arrangement may provide better isolation when the T switch is open. In another embodiment, the bottom plates of capacitor array CA0 may be coupled to voltage inputs VIN00-VIN03 through other switching apparati, such as a single switch.

The bottom plates of capacitor array CA0 may also be coupled to the output of both UAB 101 and half-UAB 102, VOUT0 and VOUT1, respectively. This coupling may be by T switches, described above, or with other switching equivalents.

Figure 1B:
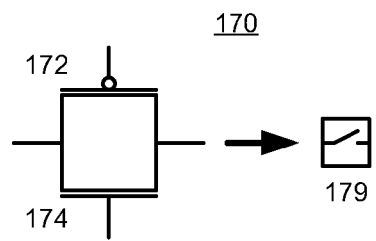
FIG. 1B illustrates a CMOS switch according to one embodiment.
Figure 1C:
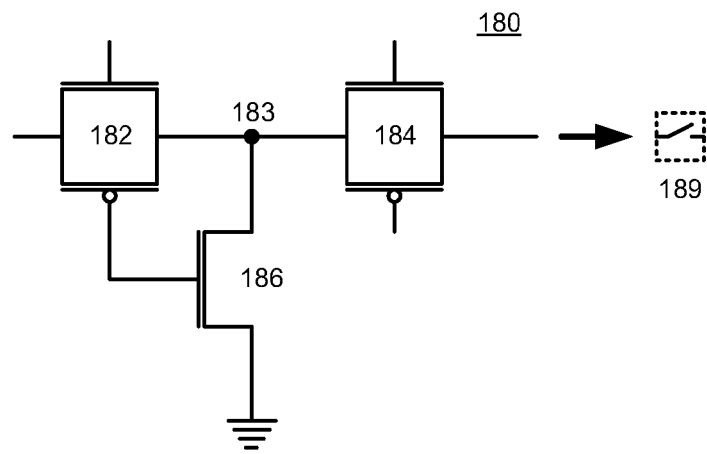
FIG. 1C illustrates a T switch according to one embodiment.
Figure 1D:
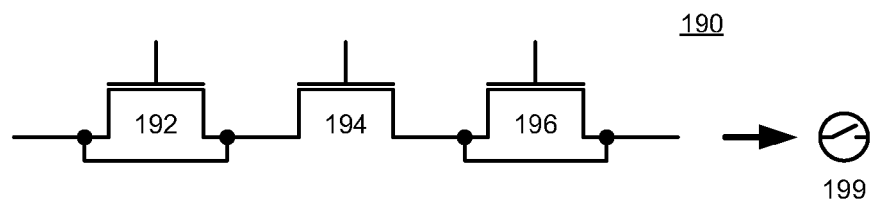
FIG. 1D illustrates a pumped N switch according to one embodiment.

The bottom plates of capacitor array CA0 may be coupled to the system ground, VSSa through a pumped N switch, a configuration of which may be seen in FIG. 1D.

The bottom plates of capacitor array CA0 may also be coupled to a common input, ComA, between half-UAB 101 and capacitor array CA1 of capacitor branch 162 of half-UAB 102 for differential integration. Inputs of the two half-UABs may be sampled separately to their respective Agnd voltage inputs. During an integration phase, the bottom plate of each of the capacitor arrays may be shorted through ComA. In other words, when coupled to ComA, capacitor arrays CA0 and CA1 of half-UABs 101 and 102, respectively, may be configured pseudo-differentially, sharing the analog ground buffers. In this configuration, common mode noise may be removed. Additionally the top plates may be coupled to a reference voltage, Ref0 and to an analog ground potential, Agnd0, which may be different than the overall system ground. In one embodiment, the connections to ComA, Ref0, and Agnd may be through a CMOS switch, as illustrated in FIG. 1C.

The top plates of capacitor array CA0 may be coupled to a number of reference voltages, including Ref0, Agnd0, VSSa (all of which may also be coupled to the bottom plate of capacitor array CA0), and Ref1. Ref1 may be coupled through a T switch. Ref0 and Agnd 0 may be coupled via a CMOS switch. VSSa may be coupled through a pumped N switch.

Half-UAB 101 may include a second capacitor branch 153, "B", with a capacitor array CB0. The bottom plates of capacitor array CB0 may be coupled to voltage inputs VIN00-VIN03, as are the bottom plates of capacitor array CA0. The bottom plates of capacitor array CB0 may also be coupled to the outputs VOUT0 and VOUT1 of both half-UAB 101 and half-UAB 102, in a similar fashion as capacitor array CA0.

The bottom plates of capacitor array CB0 may be coupled to the system ground, VSSa through a pumped N switch, similar to the connections of CA0.

The bottom plates of capacitor array CB0 may also be coupled to a common input, ComB, between half-UAB 101 and capacitor array CB1 of capacitor branch 163 of half-UAB 102. When coupled to ComB, Capacitor arrays CB0 and CB1 may be configured pseudo-differentially, like capacitor arrays CA0 and CA1, above. Additionally the bottom plates may be coupled to a reference voltage, Ref0 and to an analog ground potential, Agnd0, which may be different than the overall system ground. In one embodiment, the connections to ComA, Ref0, and Agnd0 may be through a CMOS switch.

The top plate of capacitor arrays CB0 may be coupled to a number of reference voltages, including Ref0, Agnd0, VSSa (all of which may also be coupled to the bottom plate of capacitor array CB0). Ref0 and Agnd 0 may be coupled via a CMOS switch. VSSa may be coupled through a pumped N switch.

Figure 4:
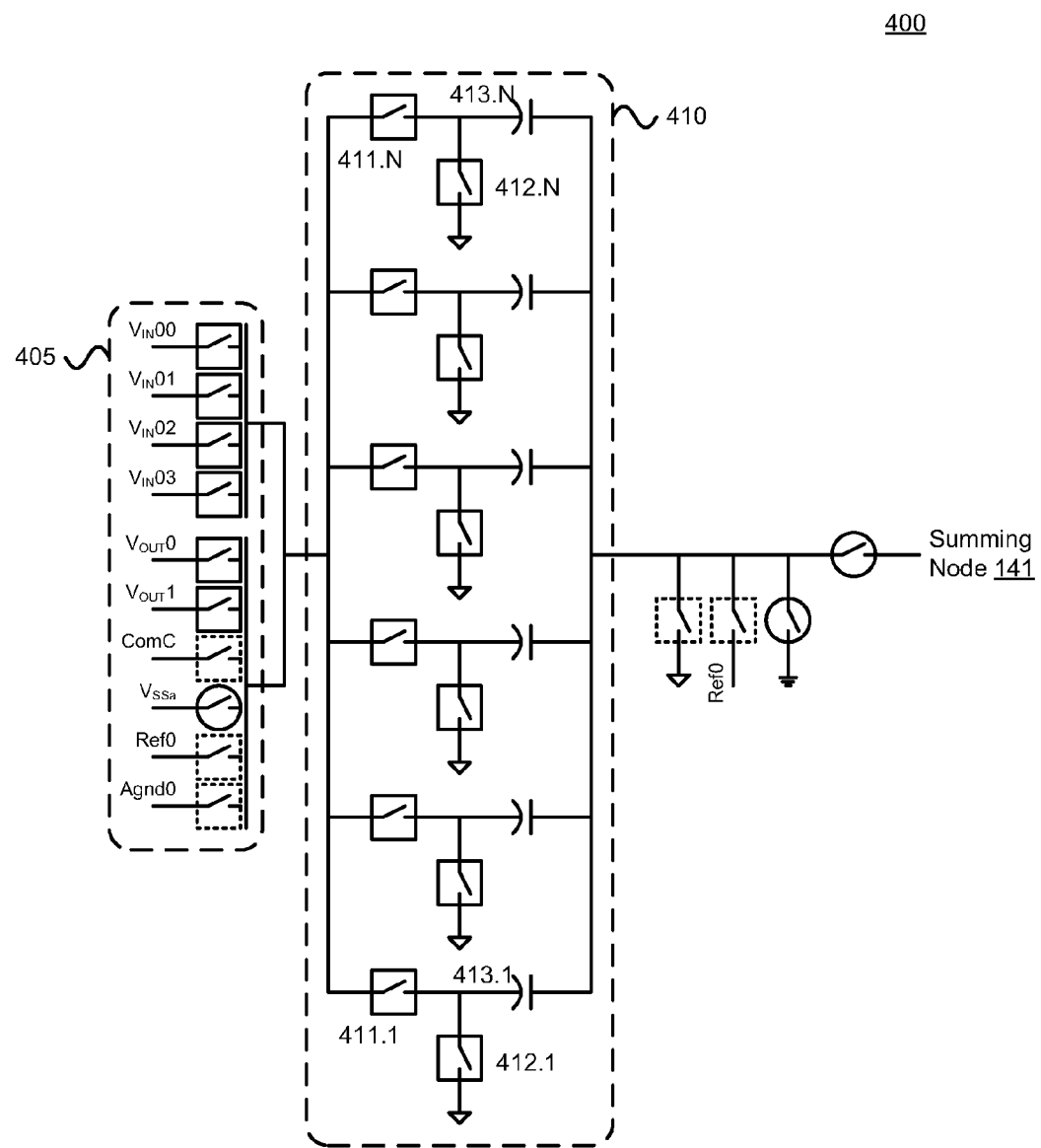
FIG. 4 illustrates a "C" capacitor branch according to one embodiment.

The top plate of capacitor array CB0 may also be coupled to attenuation capacitors Catt0 and Ctc0, which are discussed in more detail with FIG. 4.

Half-UAB 101 may include a third capacitor branch 154, "C", with a capacitor array CC0. The bottom plate of capacitor array CC0 may be coupled to voltage inputs VIN00-VIN03, as are capacitor arrays CA0 and CB0. The bottom plates of capacitor array CC0 may also be coupled to the output of both half-UAB 101 and capacitor array CB1 of capacitor branch 164 of half-UAB 102, in a similar fashion as capacitor arrays CA0 and CB0.

The bottom plates of capacitor array CC0 may be coupled to the system ground, VSSa through a pumped N switch, similar to the connections of capacitor arrays CA0 and CB0. The bottom plates of capacitor array CC0 may also be coupled to a common input, ComC, shared between bottom plates of capacitor array CC0 of capacitor branch 154 of half-UAB 101 and the bottom plates of capacitor array CC1 of capacitor branch 164 half-UAB 102. When coupled to ComC, capacitor arrays CC0 and CC1 may be configured pseudo-differentially, like capacitor arrays CA0 and CA1, above. Additionally the bottom plates may be coupled to a reference voltage, Ref0 and to an analog ground potential, Agnd0, which may be different than the overall system ground. In one embodiment, the connections to ComA, Ref0, and Agnd0 may be through a CMOS switch.

The top plate of capacitor array CC0 may be coupled to a number of reference voltages, including Ref0, Agnd0, VSSa (all of which may also be coupled to the bottom plate of capacitor array CB0). Ref0 and Agnd 0 may be coupled via a CMOS switch. VSSa may be coupled through a pumped N switch.

The top plate of capacitor array CC0 may also be coupled to the top plates of capacitor arrays CA1 (of capacitor branch 162), CB1 (of capacitor branch 163), and CC1 (capacitor branch 164) of half-UAB 102, which may also permit connection to the input of the operational amplifiers of the integrator of half-UAB 102.

Half-UAB 101 may include a fourth capacitor branch 155, "F", with a capacitor array CF0. The top plates of capacitor array CF0 may be coupled to the top plates of capacitor arrays CA0 (of capacitor branch 152), CB0 (of capacitor branch 153), and CC0 of capacitor branch 154). The bottom plate of capacitor array CF0 may be coupled to Agnd0 through a CMOS switch.

Top plates of all of the capacitor branches 152, 153, 154 and 155 may be coupled to the voltage output VOUT0.

The top plates of capacitor arrays CA0, CB0, CC0, and CF0 may be coupled to the input of amplifier 112. Amplifier 112 may include operational amplifiers (opamp) 120 and comparator 121. The negative input of opamp 120 may be coupled to the top plates of capacitor arrays CA0, CB0, CC0, and CF0. The positive input of opamp 120 may be coupled to voltage inputs VIN00-VIN03 through T switches and to Ref0 and Agnd0 through CMOS switches. The output of opamp 120 may be coupled to the negative input of comparator 121. The positive input of comparator 121 may be coupled to the output of half-UAB1, VOUT1, through a T switch or to Ref0 and Agnd0 through CMOS switches. Comparator 121 may have an output, COMPOUT0

Half-UAB 102 may include a first capacitor branch 162, "A", with a capacitor array CA1. The bottom plates of capacitor array CA1 may be coupled to a number of inputs including voltage inputs VIN00-VIN03, as is CA0 from capacitor branch 152 of half-UAB 101. In one embodiment, voltage inputs VIN00-VIN03 may be coupled to the top plates of capacitor array CA1 through T switches.

The top plates of capacitor array CA1 may also be coupled to the outputs of both half-UAB 101 and half-UAB 102, VOUT0 and VOUT1, respectively. This coupling may be by T switches, described above, or by other switching equivalents.

The bottom plates of capacitor array CA1 may be coupled to the system ground, VSSa through a pumped N switch, as described with regard to capacitor array CA0 of capacitor branch 152, above.

The bottom plates of capacitor array CA1 may also be coupled to a common input, ComA, which is also coupleable to the bottom plates of capacitor array CA0 of capacitor branch 152. When coupled to ComA, capacitor arrays CA0 and CA1 may be configured pseudo-differentially, sharing the analog ground buffers. In this configuration, the bottom plates of the capacitors of capacitor arrays CA0 and CA1 may be shorted together, removing any common mode noise. Additionally the top plates of capacitor array CA1 may be coupled to a reference voltage, Ref1 and to an analog ground potential, Agnd1, which may be different than the overall system ground to the Agnd0. In one embodiment, the connections to ComA, Ref1, and Agnd1 may be through a CMOS switch, similar to the connections of CA0 to ComA, Ref0, and Agnd0.

The top plates of capacitor array CA1 may be coupled to a number of reference voltages, including Ref1, Agnd1, VSSa (all of which may also be coupled to the bottom plate of capacitor array CA1), and Ref0. Ref0 may be coupled through a T switch. Ref1 and Agnd1 may be coupled via a CMOS switch. VSSa may be coupled through a pumped N switch.

Half-UAB 102 may include a second capacitor branch 163, "B", with a capacitor array CB1. The bottom plates of capacitor array CB1 may be coupled to voltage inputs VIN00-VIN03, as are the bottom plates of capacitor array CA1 of capacitor branch 162. The bottom plates of capacitor array CB1 may also be coupled to output VOUT0 and VOUT1 of half-UAB 101 and half-UAB 102, respectively.

The bottom plates of capacitor array CB1 may be coupled to the system ground, VSSa through a pumped N switch, similar to the connections of CA1.

The bottom plates of capacitor array CB1 may also be coupled to a common input, ComB, which may also be coupled to the bottom plates of capacitor array CB0 of capacitor branch 153 of half-UAB 101. When coupled to ComB, Capacitor arrays CB0 and CB1 may be configured pseudo-differentially, as are CA0 and CA1, above. Additionally the bottom plates may be coupled to Ref1 and Agnd0. In one embodiment, the connections to ComA, Ref0, and Agnd0 may be through a CMOS switch, similar to that described with regard to capacitor array CB0.

The top plates of capacitor array CB1 may be coupled to a number of reference voltages, including Ref1, Agnd1, VSSa (all of which may also be coupled to the bottom plate of capacitor array CB1). Ref1 and Agnd 1 may be coupled via a CMOS switch. VSSa may be coupled through a pumped N switch.

The top plate of capacitor array CB1 may also be coupled to attenuation capacitors Catt1 and Ctc1, which are discussed in more detail with FIG. 4.

UAB 102 may include a third capacitor branch 164, "C", with a capacitor array CC1. The bottom plates of capacitor array CC1 may be coupled to voltage inputs VIN00-VIN03, as may be the bottom plates of CA1 and CB1. The bottom plates of capacitor array CC1 may also be coupled to outputs VOUT0 and VOUT1 of half-UAB 101 and half-UAB 102, respectively The bottom plates of capacitor array CC1 may be coupled to the system ground, VSSa, through a pumped N switch, similar to the connections of CA1 and CB1 to system ground VSSa.

The bottom plates of capacitor array CC1 may also be coupled to a common input, ComC, which may also be coupled to the bottom plates of capacitor array CC0 of capacitor branch 154 of half-UAB 101. When coupled to ComC, capacitor arrays CC0 and CC1 may be configured pseudo-differentially, as are CA0 and CA1, above. Additionally the top plates may be coupled to a reference voltage, Ref0 and to an analog ground potential, Agnd0, which may be different than the overall system ground. In one embodiment, the connections to ComC, Ref0, and Agnd0 may be through a CMOS switch, as describe above with regard to capacitor array CC0.

The top plate of capacitor array CC1 may be coupled to a number of reference voltages, including Ref1, Agnd1, VSSa (all of which may also be coupled to the bottom plate of capacitor array CB0). Ref1 and Agnd1 may be coupled via a CMOS switch. VSSa may be coupled through a pumped N switch.

The top plate of capacitor array CC1 may also be coupled to the bottom plates of capacitor arrays CA0 (of capacitor branch 152), CB0 (of capacitor branch 153), and CC0 (of capacitor branch 154) of half-UAB 101, which may also permit connection to the negative input of the operational amplifier 120 of the amplifier 112 of half-UAB 101.

Half-UAB 102 may include a fourth capacitor branch 165, "F", with a capacitor array CF1. The top plates of capacitor array CF0 may be coupled to the top plates of capacitor arrays CA1, CB1, and CC1. The bottom plates of capacitor array CF1 may be coupled to Agnd1 through a CMOS switch.

Outputs of capacitor branches 162, 163, 164, and 165 may be coupled to the voltage output VOUT1 through the bottom plates of capacitor arrays CA1, CB1, CC1, and CF1.

The top plates of capacitor arrays CA1, CB1, CC1, and CF1 a may be coupled to the negative input of amplifier 113. Amplifier 113 may include opamp 130 and comparator 131. The negative input of opamp 130 may be selectively coupled to top plates of capacitor arrays CA1, CB1, CC1, and CF1. The positive input of opamp 130 may be coupled to voltage inputs VIN10-VIN13 through T switches and to Ref0 and Agnd0 through CMOS switches. The output of opamp 130 may be coupled to the negative input of comparator 131. The positive input of comparator 131 may be coupled to the output of half-UAB 102, VOUT1 through a T switch or to Ref0 and Agnd0 through CMOS switches. Comparator 131 may have an output COMPOUT1.

FIG. 1 illustrates the top plates of the capacitor arrays coupled to a summing node (the node common to all of the capacitor branches of each half-UAB). Although not specifically labeled, one of ordinary skill in the art would understand that the node common to all of the branches is this summing node. This summing node may also be coupled to an input of the amplifier circuit of each half-UAB. The top plate of the "C" branch of each half-UAB is also coupled to the input of the amplifier of the other half-UAB. This coupling may be to the summing node of the other half-UAB. Parasitic capacitance may be higher on bottom plates. As parasitic capacitance may degrade performance, reducing parasitic capacitance on the summing node is preferred.

The capacitor branches of the two half-UABs may be configured as feedback paths or feed forward paths. In one embodiment, two half-UABs (first and second) may be configured as the first stage and the second stage, respectively. In a feedback implementation, a capacitor branch (A, B, C, or F) of a first half-UAB may be coupled to an input of the same half-UAB. By way of example, the output, VOUT0 of half-UAB 101 may be coupled back to the input of half-UAB 101. In this configuration, a feedback circuit is created. In a different embodiment, the second stage half-UAB may have an output that is coupled to the first half-UAB input to form a feedback path. By way of example, the output, VOUT1 of half-UAB 102 may be coupled back to the input of half-UAB 101.

In a feed forward implementation, a capacitor branch (A, B, C, or F) of a first stage half-UAB may be coupled to an input of a second stage half-UAB. This configuration may be achieved by coupling the output, VOUT0, of half-UAB 101 to the input of half-UAB 102.

In various embodiments of the above-described feedback and feed forward paths, different capacitor branches may be coupled to the output of their respective half-UABs to implement various analog functions as illustrated in FIGS. 7-14.

FIG. 1B illustrates one embodiment of a CMOS switch 170, according to one embodiment. CMOS switch 170 may include PFET 172 and NFET174 with their sources and drains coupled together. The symbol for CMOS switch 170 as used in FIGS. 1-6 is illustrated as switch 179.

FIG. 1C illustrates one embodiment of a T switch 180 according to one embodiment. T switch 180 may be have a first CMOS switch 182 and a second CMOS switch 184 in series. The middle node 183 between transistor 182 and transistor 154 may be pulled to ground through NFET 186 when T switch 180 is open. When T switch 180 is open, NFET 186 may provide better isolation, since the node 183 is pulled to ground. The symbol for T switch 180 as used in FIGS. 1-6 is illustrated as switch 189.

FIG. 1D illustrates one embodiment of a pumped N-switch 190 according to one embodiment. Pumped N-switch 190 may include a first NFET 192, a second NFET 194, and a third NFET 196 in series. NFET 192 and NFET 196 may have their sources and drains shorted. The symbol for pumped N-switch switch 190 as used in FIGS. 1-6 is illustrated as switch 199.

Figure 2:
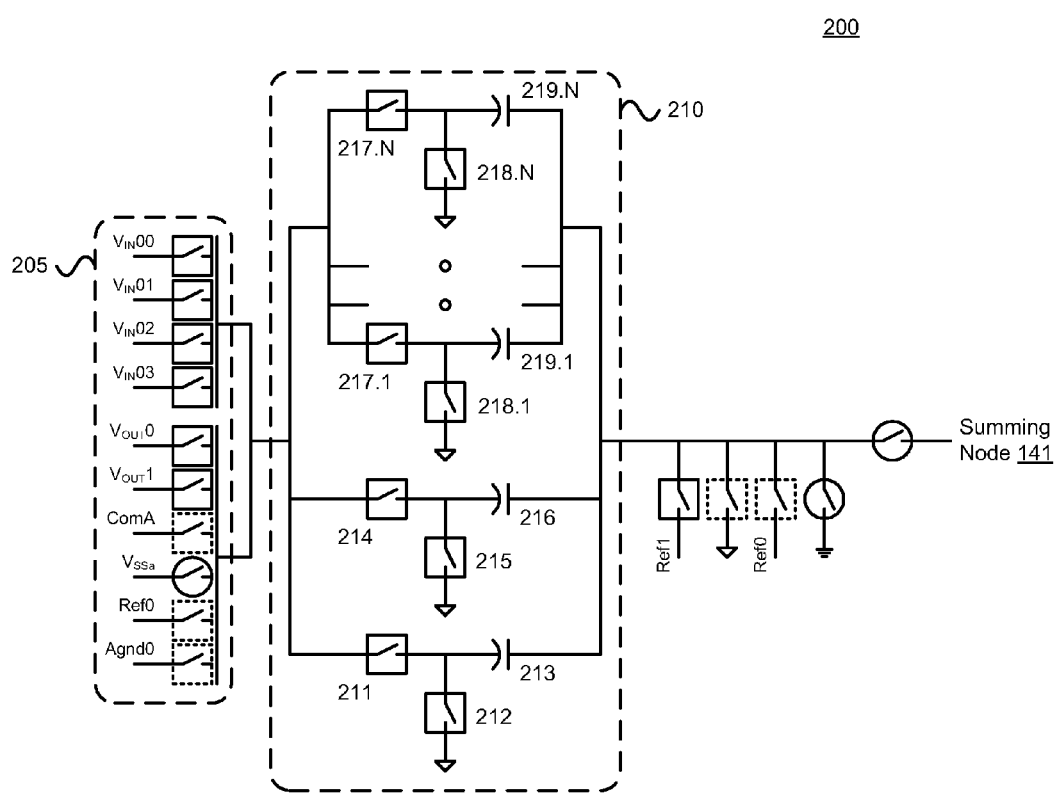
FIG. 2 illustrates an "A" capacitor branch according to one embodiment.

FIG. 2 illustrates one embodiment of the "A" capacitor branch 200 (capacitor branches 152 and 162 of FIG. 1). Capacitor branch 200 may include a capacitor array 210 with bottom plates of capacitors coupled to a number of voltage inputs 205. In one embodiment, the signals that may be applied to voltage inputs may include those described with regard to capacitor branches 152 and 162 of FIG. 1, though only the specific voltage signals from capacitor branch 152 are shown. The capacitors of capacitor array 210 may have individual switch control on every bottom plate to voltage inputs 205. Capacitors 213 and 216 may be coupled to voltage inputs 205 through a first switch 211 and 214, respectively, and to analog ground through a second switch 212 and 215, respectively. In one embodiment, the connection of capacitors 213 and 216 to the voltage inputs may be binary coded. Capacitor array 210 may also include capacitors 219.1-219.N, which may be coupled to voltage inputs 205 through first switches 217.1-217.N and to analog ground through second switches 218.1-218.N. Top plates of capacitors 213, 216, and 219.1-219.N may be coupled to a summing node (141 or 142 of FIG. 1). In one embodiment, capacitors 219.1-219.N may be thermometer coded, which may improve differential non-linearity of the capacitor branch. In one embodiment, switches 211, 214, and 217.1-217.N may be T switches, while switches 212, 215, and 218.1-218.N may be CMOS switches.

Capacitor array 210 may be 6-bit trim capable, with a unit cell of 50 femtofarads, leading to a capacitance range from 50 femtofarads to 3.2 picofarads.

Figure 3:
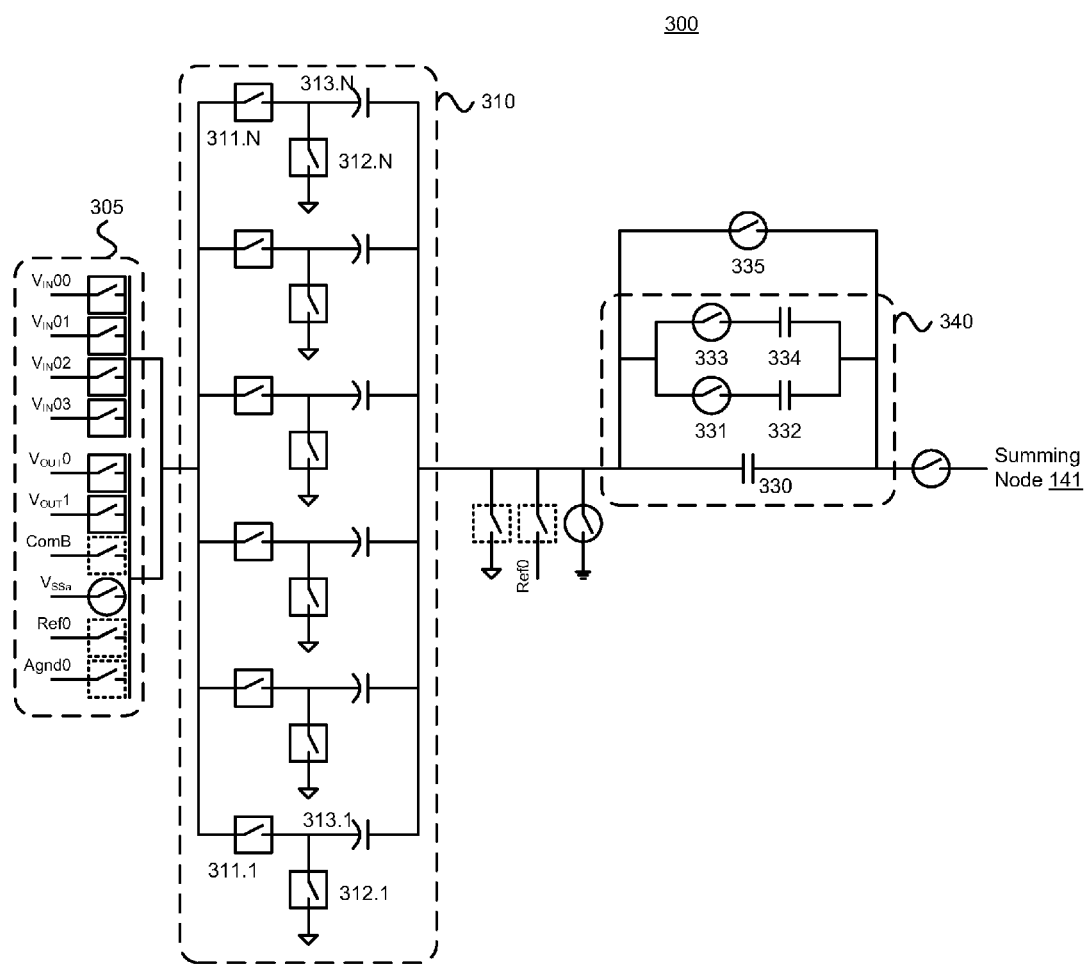
FIG. 3 illustrates a "B" capacitor branch and an attenuation circuit according to one embodiment.

FIG. 3 illustrates one embodiment of the "B" capacitor branch 300 (capacitor branches 153 and 163 of FIG. 1). Capacitor branch 300 may include a capacitor array 310 with bottom plates of capacitors coupled to a number of voltage inputs 305. In one embodiment, the signals that may be applied to voltage inputs may include those described with regard to capacitor branches 153 and 163 of FIG. 1, though only the specific voltage signals from capacitor branch 153 are shown. Capacitor branch 300 may include capacitor array 310 with capacitors 313.1-313.N coupled to voltage inputs through bottom plate switches 311.1-311.N. Capacitors 313.1-313.N of capacitor array 310 may have individual switch control on every bottom plate. The bottom plates of each of the capacitors 313.1-313.N may also be coupled to analog ground through switches 312.1-312.N. In one embodiment, switches 311.1-311.N may be T switches. In another embodiment, stitches 312.1-312.N may be CMOS switches. Capacitor array 310 may be a 6-bit binary coded array of capacitors. The top plates of the capacitors 313.1-313.N may also be coupled to analog ground, a reference voltage, Ref0, or system ground, as well as to a summing node (141 or 142 of FIG. 1). The top plates of capacitors 313.1-313.N of capacitor array 310 may also be coupled to an attenuation capacitor array 340. Attenuation capacitor array 340 may include a main attenuation capacitor 330 as well as programmable attenuation capacitors 332 and 334 coupled to capacitor array 310 through switches 331 and 333, respectively. In one embodiment attenuation capacitor 330 may have a value of 50 femtofarads with a 2-bit trim. While two programmable attenuation capacitors are shown, one of ordinary skill in the art would understand that as few as one may be used. Alternatively, a number of programmable attenuation capacitors greater than two may also be used. In still another embodiment, attenuation capacitor 340 may be bypassed by switch 335, thus creating a capacitor branch similar to the "C" capacitor branch of FIG. 1 and described in detail in FIG. 4.

FIG. 4 illustrates one embodiment of a "C" capacitor branch 400 as illustrated as capacitor branches 154 and 164 in FIG. 1. Capacitor branch 400 may include a capacitor array 410 with bottom plates of capacitors coupled to a number of voltage inputs 405. In one embodiment, the signals that may be applied to voltage inputs may include those described with regard to capacitor branches 154 and 164 of FIG. 1, though only the specific voltage signals from capacitor branch 154 are shown. Capacitor branch 400 may include capacitor array 410 may include capacitors 413.1-413.N with their bottom plates coupled to the voltage inputs 405 through bottom plate switches 411.1-411.N and to analog ground through switches 412.1-412.N. Capacitors 413.1-413.N of capacitor array 410 may have individual switch control on every bottom plate. In one embodiment, switches 411.1-411.N may be T switches. In another embodiment, switches 412.1-412.N may be CMOS switches. Capacitors in capacitor array 410 may have a top plate that may be coupled to a summing node (141 and 142 of FIG. 1). Capacitor array 410 may be a 6-bit binary coded array of capacitors. In one embodiment, each of the capacitors 411.1-411.N of capacitor array 510 may have 6-bit binary weighted programmability. As with capacitor branches 200 and 300, capacitor branch 400 may be used as a feedback or feed-forward path for other paths or half-UABs (of FIG. 1).

Figure 5:
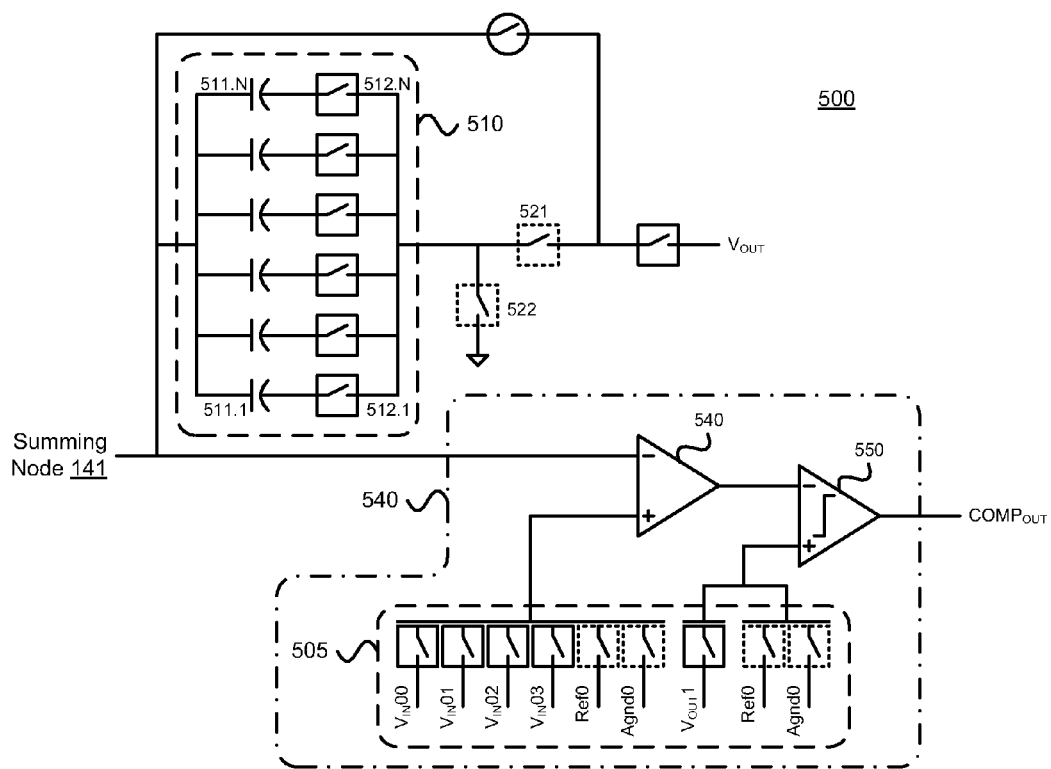
FIG. 5 illustrates an "F" capacitor branch and an integrating circuit according to one embodiment.

FIG. 5 illustrates one embodiment of an "F" capacitor branch 500 from FIG. 1. Capacitor branch 500 may include a capacitor array 510 with bottom plates of capacitors coupled to a number of voltage inputs 505. In one embodiment, the signals that may be applied to voltage inputs may include those described with regard to capacitor branches 155 and 165 of FIG. 1, though only the specific voltage signals from capacitor branch 155 are shown. F capacitor branch 500 may include capacitor array 510 with capacitors 511.1-511.N, the top plate of which may be coupled to an input of amplifier circuit 540 and the bottom plate of which may be coupled to an output, VOUT, or analog ground through switches 512.1-512.N.

In one embodiment, amplifier 540 may include an opamp 542 and a comparator 544. While the negative input of opamp may be coupled to the top plate of capacitors 511.1-511.N, the positive input of opamp 542 may be coupled to various inputs of voltage inputs 505. The output of opamp 542 may be coupled to the negative input of comparator 544 and the positive input may be coupled to other various inputs of voltage inputs 505. While FIG. 5 shows that the inputs to opamp 542 and comparator 544 are mutually exclusive, one of ordinary skill in the art would understand that the same signals may be coupled to both opamp 542 and opamp 544, depending on design requirements. FIG. 5 is not intended to limit the inputs to amplifier circuit 540 to that which is described herein. Similarly, while voltage inputs 505 are illustrated as coupled to the positive inputs of opamp 542 and 544 and the top plate of capacitors 511.1-511.N are coupled to the negative input of opamp 542, one or ordinary skill in the art would understand that these connections may be switches. That is, voltage inputs may be coupled to the positive inputs of opamp 542 and comparator 544

While amplifier 540 is shown as part of capacitor branch 500, the negative input of amplifier 540 may be coupled to the top plate of any capacitor branches, 200, 300, 400, or 500. Such a topology is illustrated in FIG. 1.

In one embodiment, amplifier 540 may be auto-zero capable and the output of amplifier 540 may be made available in a pre-determined clock phase. The gain of amplifier 540 may be determined by the ratio of the input capacitance (from A, B, and C capacitor branches as shown in FIG. 1) to the capacitance of the capacitor array 510. In one embodiment, the opamp input pair is NMOS-based, which may offset the increase in thermal noise due to correlated double sampling (auto-zeroing).

Figure 6:
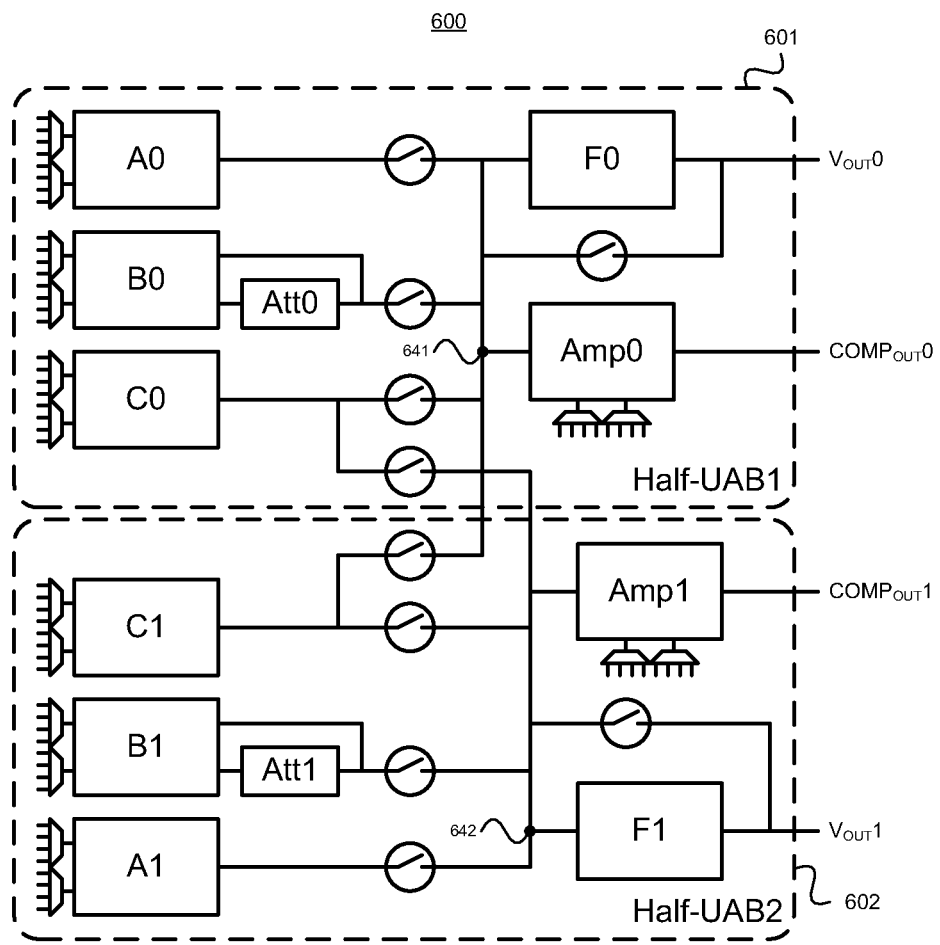
FIG. 6 illustrates the capacitor branches of FIGS. 1-5 in a simplified block diagram according to one embodiment.

FIG. 6 illustrates the various capacitor branches of FIGS. 1-5 in a simplified schematic of a UAB 600. UAB 600 may include two halves, or sections, 601 and 602. Each half-UAB, or section, 601 and 602 may have analogous elements. The top plates of capacitor branches A0, B0, C0 and C1 may be coupled to the top plate of capacitor branch F0 and amplifier Amp0 through a summing node 641. The top plates of capacitor branches A1, B1, C0, and C1 may be coupled to the top plate of capacitor branch F1 and amplifier Amp1 through a summing node 642. Additionally, the top plates of capacitor branches B0 and B1 may be coupled to attenuators Att0 and Att1, respectively. Attenuators Att0 and Att1 may be coupled to the top plates of capacitor branches F0 and F1, respectively, and/or amplifiers Amp0 and Amp1, respectively. Connections of attenuators Att0 and Att1 to amplifiers Amp0 and Amp1 may be through the summing nodes 641 and 642. The bottom plates of all branches of half-UABs 601 and 602 may be output to the respective output signals, VOUT0 and VOUT1.

In various embodiments, capacitor branches 200, 300, 400, and 500 may be discrete time or continuous time. They may also create a feed forward path or a feedback path. As a feedback path, the top plate and bottom plate of capacitors in capacitor branch 200, 300, 400, and 500, which may be part of a first-stage or second-stage half-UAB, may be coupled to an input of the first stage half-UAB. As a feed forward path, the top plate of capacitors in capacitor branch 200, 300, 400, or 500 of a first-stage half-UAB may be coupled to input voltages of a second-stage half-UAB, as described with regard to feedback and feed forward paths using UAB 100 of FIG. 1

FIGS. 7-14 illustrate various combinations of the various capacitor branches illustrated in FIGS. 1-6 to achieve various functions. Reference to specific capacitor arrays may be to the arrays illustrated in FIG. 1 and illustrated in greater detail in FIGS. 2-5.

Figure 7:
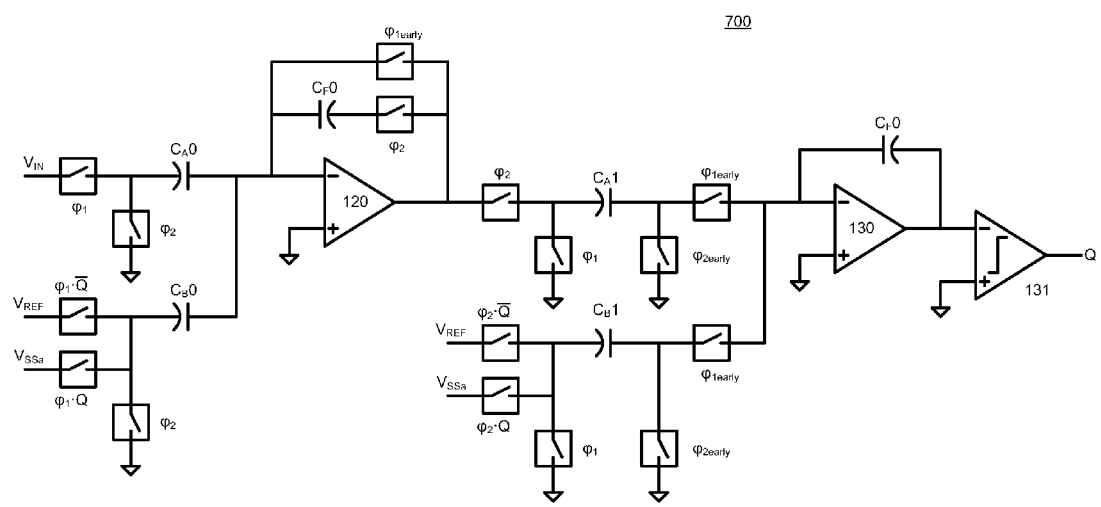
FIG. 7 illustrates one embodiment of a cascade of integrators feedback (CIFG) delta sigma analog-to-digital converter (ADC) from the configurable capacitor array according to one embodiment.

FIG. 7 illustrates a second order CIFB delta sigma modulator using the configurable capacitor branches, according to one embodiment. The top plate of the capacitor array of capacitor branch CA0 may be coupled to one of the voltage inputs VIN01-VIN03 or Agnd0. The top plate of the capacitor array of capacitor branch CB0 may be coupled alternatively to Ref0 or VSSa and to Agnd0. The bottom plates of CA0 and CB0 may be coupled to the top plate of the capacitor array of capacitor branch CF0 and to the negative input of opamp 120 of amplifier 112. Capacitor branch may form a feedback circuit with opamp 120 and the positive input of opamp 120 may be coupled to Agnd0. The capacitor array of capacitor branch CA1 may be coupled to the output of opamp 120 and to the negative input of opamp 130 of Amplifier 113. The bottom plate of the capacitor array of capacitor branch CB1 may also be connected to the negative input of opamp 130 of amplifier 113, as well as Agnd1. The top plate the capacitor array of capacitor branch CB1 may be coupled alternately to Vref1 and VSSa as well as to Agnd0.

Finally the capacitor array of capacitor branch CF1 may be coupled between the output and the negative input of opamp 130 of amplifer 113.

Switch phases for all switches of the above configuration are illustrated in FIG. 7.

Figure 8:
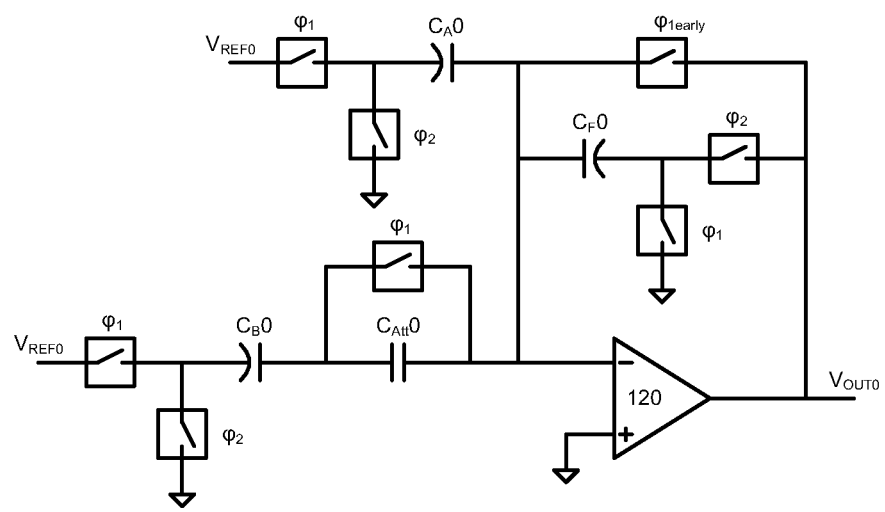
FIG. 8 illustrates one embodiment of a digital-to-analog converter (DAC) from the configurable capacitor array according to one embodiment.

FIG. 8 illustrates one embodiment of a single-ended digital-to-analog converter (DAC) 800 according to one embodiment. The single ended DAC 800 of FIG. 8 requires the use of only one half-UAB, but can be implemented using half-UAB 101, half-UAB 102, or a combination of resources from both. The top plates of the capacitor arrays of capacitor branches CA0 and CB0 may be coupled to Vref0 or Agnd. The bottom plate of the capacitor array of capacitor branch CB0 may be coupled to the attenuation capacitor Cattn0, which, along with the bottom plate of the capacitor array of capacitor branch CA0 may be coupled to the top plate of the capacitor array for capacitor branch CF0 and to the negative input of opamp 120. Capacitor branch CF0 may be coupled between in negative input and the output of opamp 120. The output of opamp 120 may provide the output voltage, VOUT0 of single-ended DAC 800.

The transfer function for single-ended DAC 800 is therefore:

$$V_{OUT}0 = V_{Agnd}0 + \frac{\left(C_A0 + \frac{C_B0 \cdot C_{attn}0}{(C_B0 + C_{attn}00 + ((2^{Bn} - 1) - C_B0))}\right)}{C_F0} \cdot (V_{REF}0 - V_{Agnd}0),$$

where CA0, CB0, and CF0 are the unit cap values of the capacitor branches, respectively, and Cattn0 is the value of the attenuation capacitor. Bn is the maximum number of the bits for the capacitors in the capacitor array of capacitor branch CB0.

Switch phases for all switches of the above configuration of single-ended DAC 800 are illustrated in FIG. 8.

Figure 9:
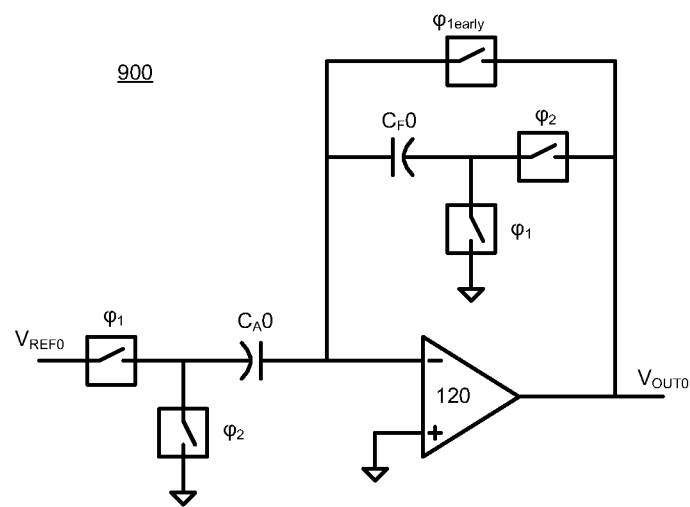
FIG. 9 illustrates one embodiment of a programmable gain amplifier from the configurable capacitor array according to one embodiment.

FIG. 9 illustrates one embodiment of a programmable gain amplifier (PGA) 900 according to one embodiment. PGA 900 may require the use of only one half-UAB, but can be implemented using half-UAB 101, half-UAB 102, or a combination of resources from both. The top plates of the capacitor arrays of capacitor branches CA0 may be coupled to Vref0 or Agnd0. The bottom plate of the capacitor array of capacitor branch CA0 may be coupled to the top plate of the capacitor array for capacitor branch CF0 and to the negative input of opamp 120. Capacitor branch CF0 may be coupled between in negative input and the output of opamp 120. The output of opamp 120 may provide the output voltage, VOUT0 of PGA 900.

The transfer function for PGA 900 is therefore:

$$V_{OUT}0 = V_{Agnd}0 + \frac{C_A0}{C_F0} \cdot (V_{REF}0 - V_{Agnd}0),$$

where CA0 and CF0 are the unit cap values of the capacitor branches, respectively.

Switch phases for all switches of the above configuration of PGA 900 are illustrated in FIG. 9.

Figure 10:
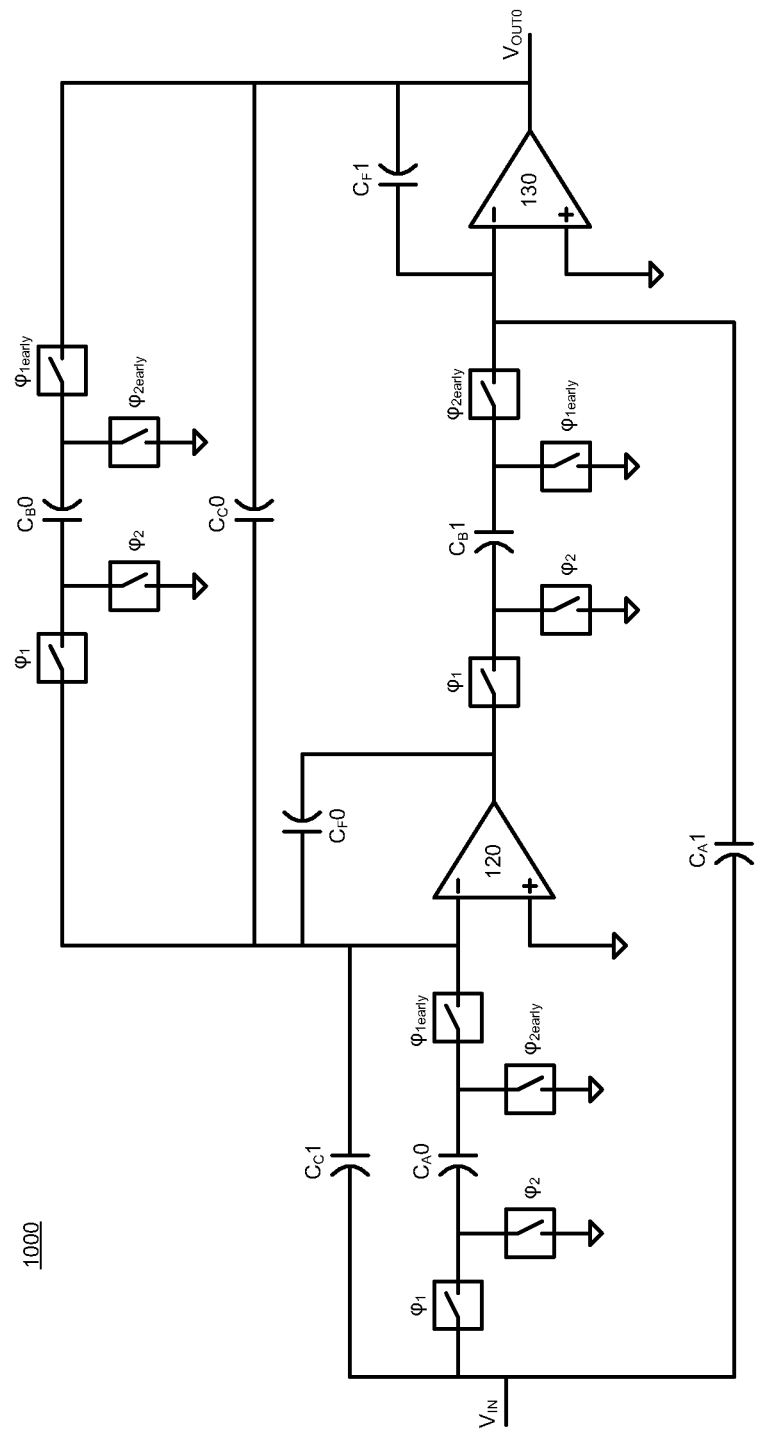
FIG. 10 illustrates one embodiment of HiQ BiQuad filter from the configurable capacitor array according to one embodiment.

FIG. 10 illustrates one embodiment of a HiQ BiQuad filter 1000 according to one embodiment. HiQ BiQuad filter 1000 may have an input voltage selectively coupled to the bottom plates of capacitor branches CA0, CA1, and CC1. The top plates of capacitor branches CA0, CA1, CB0, CC0, CC1, and CF0 may be coupled to the summing node 155 of opamp 120. In one embodiment, CA0 may be configured to operate as discrete time while CC1 may be configured to run as continuous time. The input voltage may also be fed forward to the input of opamp 130, through summing node 156. The input of opamp 130 may also be coupled to the top plates of capacitor branches CB1 and CF1. The output of opamp 120 may drive the input of opamp 130 through capacitor branch CC1. The output of opamp 130 may be fed back to the input of opamp 120 through capacitor branch CC0.

Switch phases for all switches of the above configuration of HiQ BiQuad filter 1000 are illustrated in FIG. 10.

Figure 11:
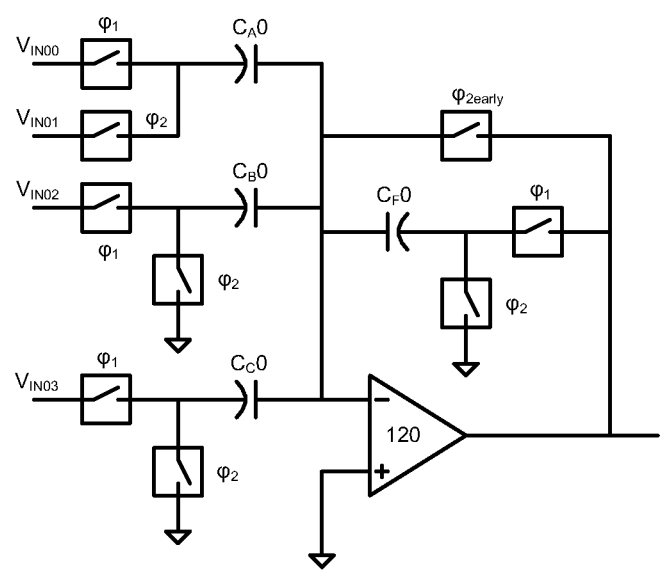
FIG. 11 illustrates one embodiment of a summing circuit from the configurable capacitor array according to one embodiment.

FIG. 11 illustrates one embodiment of a summing circuit 1100 according to one embodiment. Summing circuit 1100 may require the use of only one half-UAB, but can be implemented using half-UAB 101, half-UAB 102, or a combination of resources from both. The top plates of the capacitor array of capacitor branches CA0, CB0, and CC0 may be coupled to VIN00 or VIN01, VIN02, and VIN03, respectively. The top plates of the capacitor arrays of capacitor branches of CB0 ad CC0 may also be coupled to Agnd0. The bottom plates of the capacitor arrays of capacitor branch CA0, CB0, and CC0 may be coupled to the top plate of the capacitor array of capacitor branch CF0 and to the negative input of opamp 120 of Int1. The bottom plate of the capacitor array of capacitor branch CF0 may be coupled to the output of opamp 120 and to Agnd0. The output of opamp 120 may be the output voltage, VOUT0 of summing circuit 1100.

Switch phases for all switches of the above configuration of summing circuit 1100 are illustrated in FIG. 11.

Figure 12:
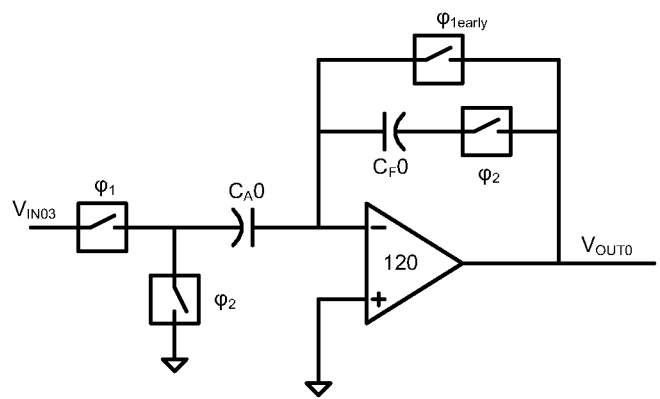
FIG. 12 illustrates one embodiment of an integrator from the configurable capacitor array according to one embodiment.

FIG. 12 illustrates one embodiment of an integrator 1200 using the capacitor branches of the present application. Integrator 1200 may require the use of only one half-UAB, but may be implemented using half-UAB 101, half-UAB 102, or a combination of resources from both. The top plate of the capacitor array of capacitor branches CA0 may be coupled to Vref0 or Agnd0. The bottom plate of the capacitor array of capacitor branch CA0 may be coupled to the top plate of the capacitor array for capacitor branch CF0 and to the negative input of opamp 120. Capacitor branch CF0 may be coupled between in negative input and the output of opamp 120. The output of opamp 120 may provide the output voltage, VOUT0 of integrator 1200. As opposed to PGA 900 of FIG. 9, sample voltages are added to the capacitors of capacitor branch CF0, thus accumulating charge and voltage thereon Switch phases for all switches of the above configuration of integrator 1200 are illustrated in FIG. 12.

Figure 13:
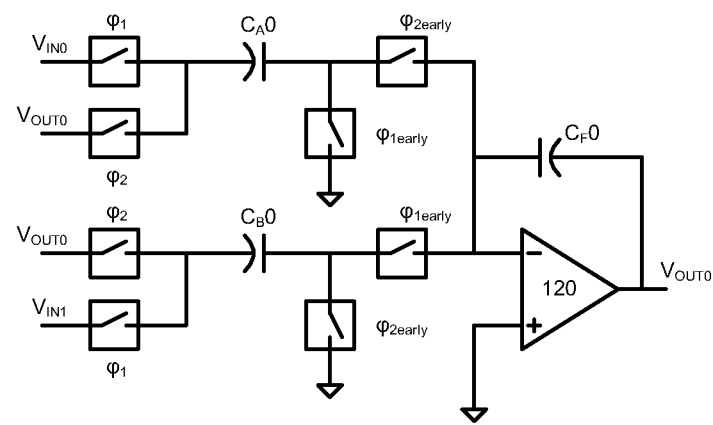
FIG. 13 illustrates one embodiment of a mixing circuit from the configurable capacitor array according to one embodiment.

FIG. 13 illustrates one embodiment of a mixing circuit 1300 using the capacitor branches of the present application. Mixing circuit 1300 may require the use of only one half-UAB, but can be implemented using half-UAB 101, half-UAB 102, or a combination of resources from both. The top plates of the capacitor array of capacitor branch CA0 may be coupled a first input voltage, VIN0, and the output voltage, VOUT0 of mixing circuit 1300. The top plates of the capacitor array of capacitor branch CB0 may be coupled a second input voltage, VIN1, and the output voltage, VOUT0 of mixing circuit 1300. The bottom plates of both capacitor arrays of capacitor branches CA0 and CB0 may be coupled to the input of opamp 120 and to Agnd0. CA0 and CB0 may be coupled to the input of opamp 120 in alternating phases. The output of opamp 120 may be the output voltage of mixing circuit 1300 and may be coupled to the input of both capacitor branches CA0 and CB0.

Switch phases for all switches of the above configuration of mixing circuit 1300 are illustrated in FIG. 13.

Figure 14:
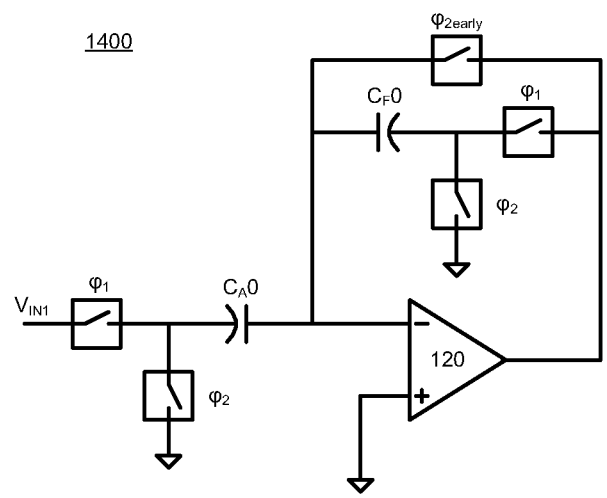
FIG. 14 illustrates one embodiment of a sample/hold comparator from the configurable capacitor array according to one embodiment.

FIG. 14 illustrates one embodiment of an of a sample/hold comparator (S/H) 1400 using the capacitor branches of the present application. S/H 1400 may require the use of only one half-UAB, but can be implemented using half-UAB 101, half-UAB 102, or a combination of resources from both. The top plates of the capacitor array of capacitor branch CA0 may be coupled to and input voltage, VIN0, or Agnd0. The bottom plate of the capacitor array of capacitor branch CA0 may be coupled to the top plate of the capacitor array for capacitor branch CB0 and to the negative input of opamp 120. Capacitor branch CB0 may be coupled between in negative input and the output of opamp 120. The output of opamp 120 may provide the output voltage, VOUT0 of S/H 1400.

Switch phases for all switches of the above configuration of S/H 1400 are illustrated in FIG. 14.

Figure 15:
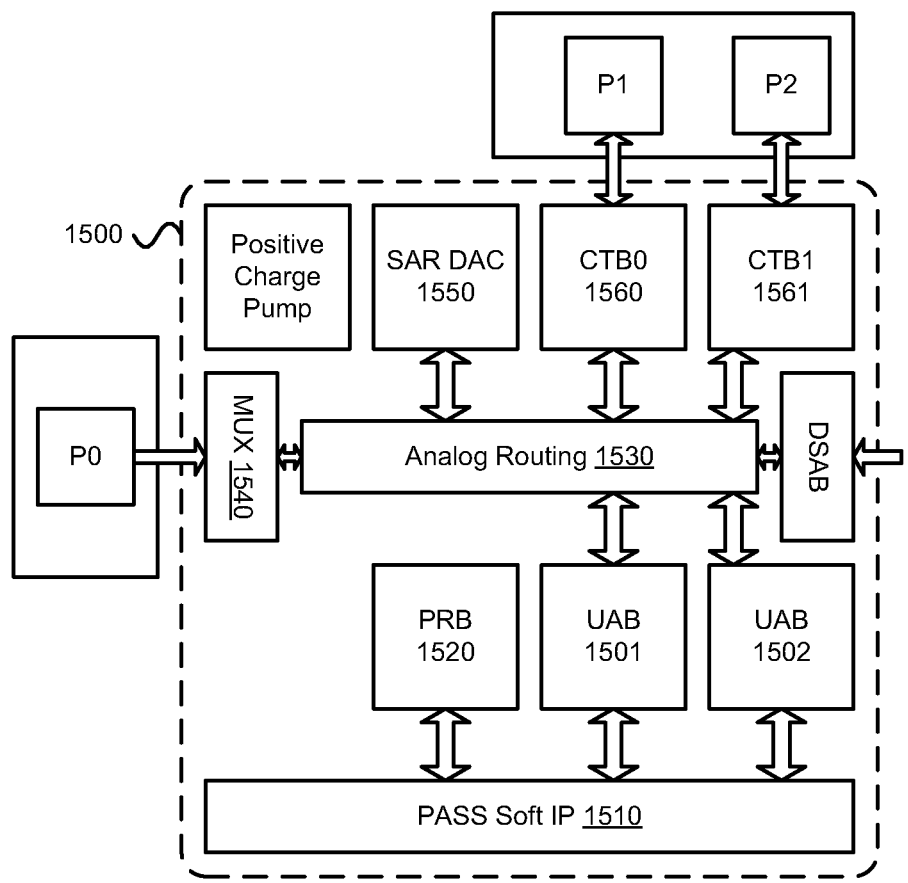
FIG. 15 illustrates one embodiment programmable analog subsystem including the configurable capacitor array according to one embodiment.

The different halves of the configurable capacitor array of the present invention may be included in a programmable analog subsystem (PASS), like that illustrated in FIG. 15. PASS 1500 may include a pair of UABs, 1501 and 1502, which may be analogous to UAB 100 of FIG. 1. UABs 1501 and 1502 may be coupled to soft IP block 1510. Soft IP block may contain registers, waveforms, and state machines that may be used to configure and operate the various portions of PASS 1500, include UABs 1501 and 1502. In one embodiment, soft IP block 1510 may also include a decimator, which may be used to filter the output of delta sigma ADC 700 of FIG. 7. Also coupled to soft IP block may be programmable reference block (PRB) 1520, which may be used to provide the various reference voltages to the inputs of the various capacitor branches of the present application. UAB0 and UAB1 may be coupled to the rest of the PASS through analog routing block 1530. Analog routing block 1530 may be used to couple the various circuit elements of PASS 1500 together. Multiplexer (MUX) 1540 may couple signals external to PASS 1500 through port P0. Signals from MUX 1540 may be channeled through analog routing block 1530. Also coupled to analog routing block may be a SAR digital-to-analog converter (SAR DAC) 1550 as well as two continuous time blocks CTB0 1560 and CTB1 1561. CTB0 1560 and CTB1 1561 may be coupled to signals external to PASS through ports P1 and P2, respectively.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "integrating," "comparing," "balancing," "measuring," "performing," "accumulating," "controlling," "converting," "accumulating," "sampling," "storing," "coupling," "varying," "buffering," "applying," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and circuits presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A configurable capacitor array comprising:
   a first plurality of capacitor branches;
   a second plurality of capacitor branches; and
   a plurality of switches coupled to and between the first and second pluralities of capacitor branches,
   wherein the first and second pluralities of capacitor branches each comprise at least one array of capacitors configurable alone or in combination to execute one of a plurality of predefined analog functions, and
   wherein the first plurality of capacitor branches comprises an integrator and a third plurality of capacitors in a third array of capacitors selectively coupled to the integrator.

2. The configurable capacitor array of claim 1, wherein the first plurality of capacitor branches comprises a plurality of inputs selectively coupled to a top plate of a first plurality of capacitors in a first array of capacitors, wherein at least two of the capacitors in the array of capacitors is binary weighted and wherein at least two of the capacitors in the array of capacitors is thermometer coded.

3. The configurable capacitor array of claim 1, wherein the first plurality of capacitor branches comprises a plurality of inputs selectively coupled to a top plate of second plurality of capacitors in a second array of capacitors, and wherein a bottom plate of the second plurality of capacitors in the second array of capacitors is selectively coupled to an attenuation circuit.

4. The configurable capacitor array of claim 3, wherein the attenuation circuit comprises:
   a first attenuation capacitor;
   a second plurality of attenuation capacitors in parallel to the first attenuation capacitor, the second plurality of attenuation capacitors selectively coupled to the bottom plate of the plurality of capacitors of the second array of capacitors; and
   a bypass circuit configured to coupled the bottom plate of the plurality of capacitors of the second array of capacitors and the bottom plate of the first attenuation capacitor.

5. The configurable capacitor array of claim 1, wherein the integrator comprises:
   a first operational amplifier coupled to a top plate of the third array of capacitors at a first input of the first operational amplifier and a third plurality of inputs at a second input of the first operational amplifier; and
   a second operational amplifier selectively coupled to the bottom plate of the third plurality of capacitors in the third array of capacitors and an output of the first operational amplifier at a third input of the second operation amplifier and at least a subset of the third plurality of inputs at the fourth input of the second operational amplifier.

6. The configurable capacitor array of claim 1, wherein the first plurality of capacitor branches comprises a plurality of inputs selectively coupled to a top plate of third plurality of capacitors in a third array of capacitors, wherein the bottom plate of the third plurality of capacitors is selectively coupled to at least one bottom plate of a capacitor in the second plurality of capacitor branches.

7. The configurable capacitor array of claim 1, wherein the predetermined analog functions are selected from the group consisting of:
   a delta-sigma analog to digital converter (ADC);
   a digital-to-analog converter (DAC);
   a programmable gain amplifier;
   a high-Q biquad;
   a summing circuit;
   an integrator;
   a mixing circuit; and
   a sample/hold (S/H) comparator.

8. A method comprising:
   providing a first plurality of capacitor branches;
   providing a second plurality of capacitor branches; and
   providing a plurality of switches coupled to and between the first and second pluralities of capacitor branches,
   wherein the first and second pluralities of capacitor branches each comprise at least one array of capacitors configurable alone or in combination to execute one of a plurality of predefined analog functions, and
   wherein the first plurality of capacitor branches comprises an integrator and a third plurality of capacitors in a third array of capacitors selectively coupled to the integrator.

9. The configurable capacitor array of claim 8, wherein the first plurality of capacitor branches comprises a plurality of inputs selectively coupled to a top plate of a first plurality of capacitors in a first array of capacitors, wherein at least two of the capacitors in the array of capacitors is binary weighted and wherein at least two of the capacitors in the array of capacitors is thermometer coded.

10. The configurable analog block of claim 8, wherein the first plurality of capacitor branches comprises a plurality of inputs selectively coupled to a top plate of second plurality of capacitors in a second array of capacitors, and wherein a bottom plate of the second plurality of capacitors in the second array of capacitors is selectively coupled to an attenuation circuit.

11. The configurable analog block of claim 10, wherein the attenuation circuit comprises:
   a first attenuation capacitor;

a second plurality of attenuation capacitors in parallel to the first attenuation capacitor, the second plurality of attenuation capacitors selectively coupled to the bottom plate of the plurality of capacitors of the second array of capacitors; and a bypass circuit configured to coupled the bottom plate of the plurality of capacitors of the second array of capacitors and the bottom plate of the first attenuation capacitor.

12. The configurable analog block of claim 8, wherein the first plurality of capacitor branches comprises:
an integrator; and
a third plurality of capacitors in a third array of capacitors selectively coupled to the integrator.

13. The configurable analog block of claim 12, wherein the integrator comprises:
a first operational amplifier coupled to a top plate of the third array of capacitors at a negative input of the first operational amplifier and a third plurality of inputs at a positive input of the first operational amplifier; and
a second operational amplifier selectively coupled to the bottom plate of the bottom plates of the third plurality of capacitors in the third array of capacitors and an output of the first operational amplifier a negative input of the second operation amplifier and at least a subset of the third plurality of inputs at the positive input of the second operational amplifier.

14. The configurable analog block of claim 8, wherein the first plurality of capacitor branches comprises a plurality of inputs selectively coupled to a top plate of third plurality of capacitors in a third array of capacitors, wherein the bottom plate of the third plurality of capacitors is selectively coupled to at least one bottom plate of a capacitor in the second plurality of capacitor branches.

15. A universal analog block comprising:
a first subsection; and
a second subsection, wherein:
  each of the first and second subsections comprises:
    a first configurable capacitor branch having a first plurality of capacitors coupled to a first plurality of inputs at a top plate of the first plurality of capacitors;
    a second configurable capacitor branch having a second plurality of capacitors coupled to a second plurality of inputs at a top plate of the second plurality of capacitors and selective coupled to an attenuation capacitor network at a bottom plate of the second plurality of capacitors;
    a third configurable capacitor branch having a third plurality of capacitors coupled to a first plurality of inputs at a top plate of the third plurality of capacitors and selectively coupled to at least one top plate of a configurable capacitor branch of another subsection; and
    a fourth configurable capacitor branch having a fourth plurality of capacitors selectively coupled to an integrator.

16. The universal analog block of claim 15, wherein the first, second, and pluralities of inputs have at least one signal in common.

17. The universal analog block of claim 15, wherein corresponding first, second, and third capacitor branches are configurable to accept differential inputs for the first and second subsections.

18. The universal analog block of claim 15, wherein the first configurable capacitor branch is configured to operate as a discrete time circuit in one configuration and as a continuous time circuit in another configuration.

19. The universal analog block of claim 15, wherein each of the first, second and third capacitor branches is selective configured to operate as a feedback circuit in a first mode of operation and a feed forward circuit in a second mode of operation.

20. The universal analog block of claim 15, wherein the first and second subsections are configured to operate independently in a first mode of operation, to Ser. No. 14/752,052 execute a first set of analog functions and to operate in conjunction in a second mode of operation to execute a second set of analog functions.

* * * * *

UNITED STATES PATENT AND TRADEMARK OFFICE
CERTIFICATE OF CORRECTION

PATENT NO.      : 9,590,592 B2
APPLICATION NO. : 14/752052
DATED           : March 7, 2017
INVENTOR(S)     : Jaskarn Singh Johal et al.

It is certified that error appears in the above-identified patent and that said Letters Patent is hereby corrected as shown below:

On the Title Page

Abstract, "A fingerprint sensing circuit, system, and method is disclosed. The fingerprint sensor maybe include a plurality of inputs coupled to a plurality of fingerprint sensing electrodes and to an analog front end. The analog front end may be configured to generate at least one digital value in response to a capacitance of at least one of the plurality of fingerprint sensing electrodes. Additionally, the analog front end may include a quadrature demodulation circuit to generate at least one demodulated value for processing by a channel engine. The channel engine may generate a capacitance result value that is based, in part, on the demodulated value and is stored in a memory" to read as --An analog block includes a comparator and a configurable capacitor array with a several capacitor branches coupled to the inputs and outputs of the comparator. The capacitor branches are coupled to and configured by a number of switches to achieve desired analog functionality of the analog block--.

In the Claims

Column 18, Line 36 to Line 37, Claim 20, "to Ser. No. 14/752,052 execute" to read as --to execute--.

Signed and Sealed this
Ninth Day of January, 2018

Joseph Matal
*Performing the Functions and Duties of the*
*Under Secretary of Commerce for Intellectual Property and*
*Director of the United States Patent and Trademark Office*